(12) United States Patent
Raj et al.

(10) Patent No.: US 11,621,035 B1
(45) Date of Patent: Apr. 4, 2023

(54) MEMORY CIRCUIT STRUCTURE WITH SUPPLY VOLTAGE TRANSMITTED VIA WORD LINE

(71) Applicant: GlobalFoundries U.S. Inc., Malta, NY (US)

(72) Inventors: Vivek Raj, Bangalore (IN); Vinayak Rajendra Ganji, Bangalore (IN); Shivraj Gurpadappa Dharne, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/447,841

(22) Filed: Sep. 16, 2021

(51) Int. Cl.
| | |
|---|---|
| *G11C 8/10* | (2006.01) |
| *G11C 11/418* | (2006.01) |
| *G11C 11/419* | (2006.01) |
| *G11C 8/08* | (2006.01) |
| *G11C 7/10* | (2006.01) |

(52) U.S. Cl.
CPC .......... *G11C 11/418* (2013.01); *G11C 7/1096* (2013.01); *G11C 8/08* (2013.01); *G11C 8/10* (2013.01); *G11C 11/419* (2013.01)

(58) Field of Classification Search
CPC ....... G11C 8/10; G11C 11/418; G11C 7/1096; G11C 8/08; G11C 11/419
See application file for complete search history.

(56) References Cited

U.S. PATENT DOCUMENTS

| | | | | |
|---|---|---|---|---|
| 6,002,635 | A | * | 12/1999 | Matano ............... G11C 11/4085 365/230.06 |
| 6,888,754 | B2 | | 5/2005 | Chih et al. |
| 7,215,591 | B2 | | 5/2007 | Vernenker et al. |
| 7,304,890 | B2 | | 12/2007 | Lambrache et al. |
| 9,202,555 | B2 | | 12/2015 | Jung et al. |
| 2013/0148445 | A1 | * | 6/2013 | Chen ........................ G11C 8/08 365/230.06 |

OTHER PUBLICATIONS

Joshi et al., "6.6 + GHz Low Vmin, read and half select disturb-free 1.2 Mb SRAM," 2007 Symposium on VLSI Circuits Digest of Technical Papers, 250-251.

* cited by examiner

*Primary Examiner* — Kretelia Graham
(74) *Attorney, Agent, or Firm* — David Cain; Hoffman Warnick LLC

(57) ABSTRACT

Embodiments of the present disclosure provide a memory circuit structure including a transistor array for writing a plurality of bits to a memory element. The transistor array includes a first transistor having a first source/drain terminal for receiving a supply voltage. A first word line is coupled between a decoder and the first source/drain terminal of the first transistor. The first word line transmits a voltage output from the decoder to the first transistor as the supply voltage.

18 Claims, 4 Drawing Sheets

MEMORY CIRCUIT STRUCTURE WITH SUPPLY VOLTAGE TRANSMITTED VIA WORD LINE

TECHNICAL FIELD

Embodiments of the disclosure relate generally to memory circuits. More specifically, the disclosure provides an apparatus and method for transmitting a supply voltage via a word line.

BACKGROUND

Memory circuits, such as random-access memory (RAM), are important to the operation of integrated circuits (ICs). Memory circuits include a collection of electrically operated bit cells that can be read and/or written in any order and can electrically store working data or machine code for a device. Some types of RAM (e.g., static RAM) in particular are a "volatile" form of memory, in that power is required to maintain the stored information. Non-volatile memory, such as magnetic RAM, continues to hold data even when there is no power to the device. Memory circuits include dedicated logic circuits to allow writing of multiple bits to a corresponding group of memory elements. This logic, however, must be instantiated multiple times during operations. The continuous activating and deactivating of the logic may produce significant electrical leakage through the logic, particularly through transistors that are coupled to a continuous power supply for the logic circuit. Past efforts to address such leakage have implemented transistors with higher threshold voltages, and/or more robust logic configurations to implement the same functionality. Such solutions may require more complex manufacturing techniques, and/or may not significantly reduce leakage in the memory cell.

SUMMARY

Aspects of the disclosure provide a memory circuit structure including: a transistor array for writing a plurality of bits to a memory element, wherein the transistor array includes a first transistor having a first source/drain terminal for receiving a supply voltage; and a first word line coupled between a decoder and the first source/drain terminal of the first transistor, wherein the first word line transmits a voltage output from the decoder to the first transistor as the supply voltage.

Further aspects of the disclosure provide a memory circuit structure including: a transistor array configured to write a plurality of bits to a memory element, the transistor array including: a first transistor including a first source/drain terminal for receiving a supply voltage, a second source/drain terminal for transmitting the supply voltage, and a gate terminal for receiving a data input, wherein the first transistor has a first doping type, a second transistor including a first source/drain terminal coupled to the second source/drain terminal of the first transistor and the memory element, and a second source/drain terminal coupled to ground; and a first word line coupled between a decoder and the first source/drain terminal of the first transistor, wherein the first word line transmits a voltage output from the decoder to the first transistor as the supply voltage.

Additional aspects of the disclosure provide a method for writing data to a memory element, the method including: transmitting, via a first word line, a supply voltage from a decoder to a source/drain terminal of a first transistor of a transistor array; and transmitting an output from a byte-enable register to a gate terminal of the first transistor, wherein the output from the byte-enable register causes the transistor array to write data to the memory element.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
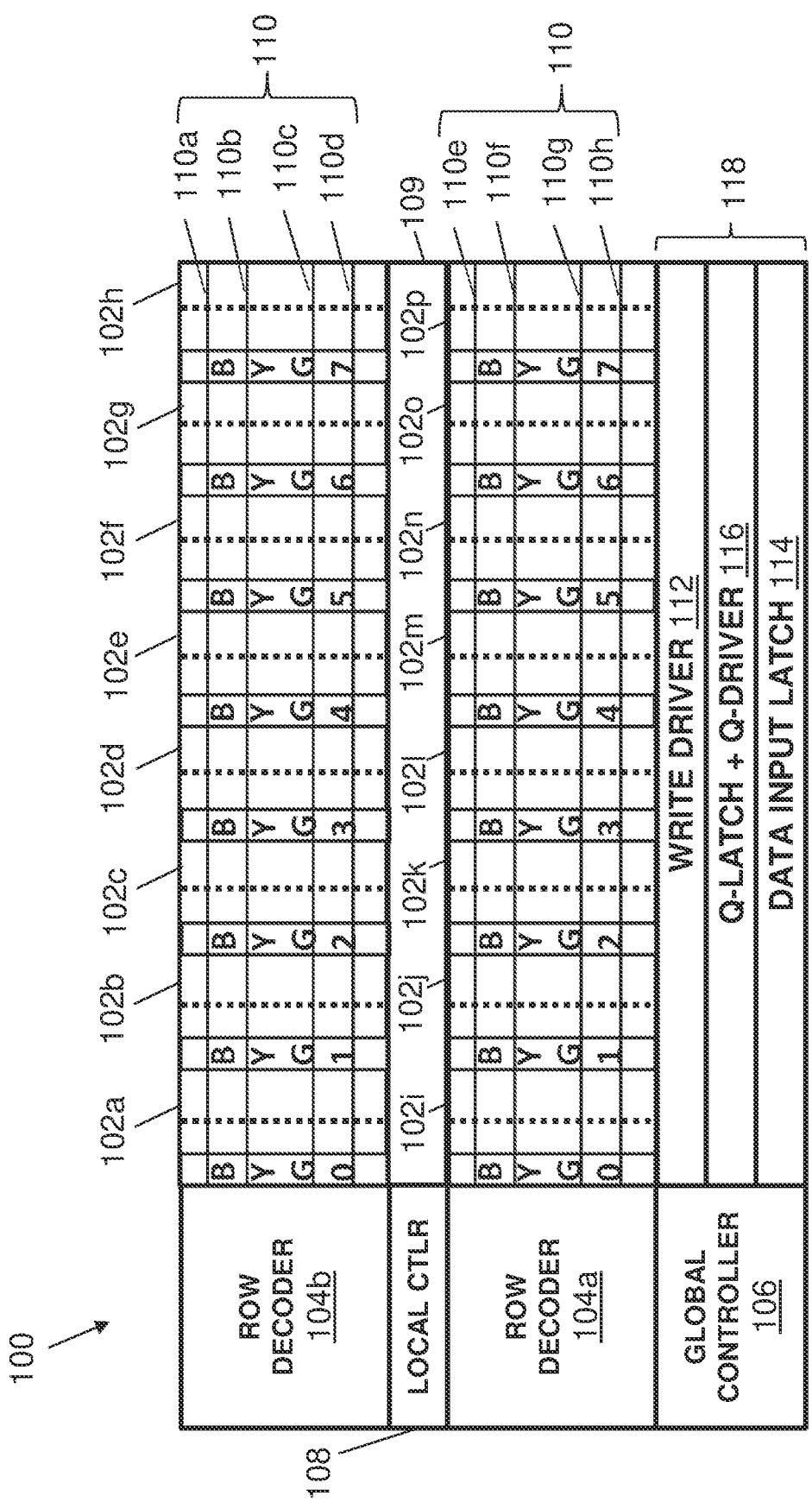
FIG. 1 shows a block diagram of a byte-write multi-port register for implementing embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present disclosure provide an apparatus and related method with a supply voltage transmitted using a word line. Embodiments of the disclosure may allow logic for memory structures, e.g., byte-write circuitry for writing multiple bits to a group of memory elements, to operate by using pulses from a word line as a supply voltage for the logic. Embodiments of the disclosure provide a memory circuit that includes a transistor array for writing several bits to a memory element. For instance, the circuit may transmit a set of eight bits to a corresponding set of eight memory elements, collectively storing a byte of data. The memory circuit routes incoming data pulses to the memory elements using a supply voltage transmitted via a word line. The circuit includes a transistor array with one transistor coupled to the word line at one of its source/drain terminals. The word line, in turn, is coupled between a decoder and the first transistor such that a voltage in the word line is supplied to the first transistor. In this configuration, the voltage in the word line electrically drives operation of transistors in the array. Transistors in the array may receive incoming data pulses at their gate terminals, which allow data to be written to the memory elements using the supply voltage.

FIG. 1 depicts a system 100 as a portion of a multi-port register capable of writing groups of binary digits ("bits") to respective groups of memory elements. Embodiments of the disclosure can be integrated into system 100, using electrically active components for control of system 100 to also route a supply voltage to circuits for writing bits to memory. A "multi-port" register differs from other register systems by allowing multiple memory elements to be read from, or written to, simultaneously using multiple electrical couplings for such operations. System 100 includes a group of memory cells 102 (individually labeled 102a through 102p), each having a set of (i.e., one or more) memory elements for recording a corresponding set of bits. Memory cells 102 may be arranged into a group of rows (four shown) and columns (three shown), with the number of rows and columns varying based on the relevant product(s) and/or architecture(s). Each row of memory cells 102 may be coupled to a respective row decoder 104 (e.g., 104a, 104b) for electrically driving a selected row of memory cells in system 100. As an example, the illustrated portion of system 100 includes two row decoders 104a, 104b each coupled to a respective row of memory cells (i.e., memory cells 102a-102h, 102i-102p). A global controller 106 can issue signals to row decoder(s) 104a to initiate reading or writing of the selected memory cell(s) 102. A local controller ("local ctlr") 108 includes circuitry for electrically enabling the reading or writing of memory cells 102 in a particular row, by generating a signal row decoder(s) 104a, 104b connected to each memory cell 102 of the row. A local input/output module ("I/O") is coupled to local controller 108 to transfer read and write bit line data to or from a global I/O module 118 of system 100. The bit lines are indicated with dashed lines in FIG. 1, and such bit lines as well as various components of global I/O module 118 are discussed in further detail elsewhere herein. Several "byte-write gates" (BYG, labeled BYG0-BYG7 in this example) include circuitry for coupling row decoder(s) 104a, 104b to memory cell(s) 102 of the row. Each byte-write gate BYG may include an array of transistors for electrically coupling row decoder(s) 104a, 104b through a word line 110 to memory cells 102, such that multiple byte-write gates BYG may couple row decoder(s) 104a, 104b and word line 110 to one memory cell 102. For example, byte-write gates BYG0, BYG1 electrically couple row decoder(s) 104a, 104b through word line 110a, 110b to memory cell 102a, and byte-write gate BYG1 also couples word line 110a, 110b to memory cell 102b. Each successive pair of word lines 110a, 110b may be set to opposite logic levels, such that word lines 110a, 110c, 110e, 110g, etc., are each referred to as a "word line" while word lines 110b, 110d, 110f, 110h, etc., are each referred to as a "word line bar."

Embodiments of the disclosure, as discussed in more detail elsewhere herein, allow a voltage supply to be delivered to byte-write gates BYG via row decoder(s) 104a, 104b, while signals for reading or writing data in memory cells 102 are delivered using column selection components. Such components include a write driver 112 coupled to global controller 106. Write driver 112 produces electrical output signals for writing data into memory cells 102 of system 100 during operation. Write driver 112, as discussed elsewhere herein, may include several register circuits (e.g., byte-write registers for writing a group of eight bits) for producing the signals for each column in system 100. Write driver 112 and/or global controller 106 each may be coupled to a data input latch 114, including a set of latches and/or other temporary memory elements for receiving incoming data signals to be written to memory cells 102. Data input latch 114 may receive incoming data from other components coupled to and/or external to system 100, such as a buffer having data signals as its output. Write driver 112 and/or global controller 106 also may be coupled to a latch-driver assembly ("Q-latch+Q-driver") 116 for synchronizing data signals of data input latch 114 with control signals from global controller 106, so they may be provided to write driver 112. Write driver 112, data input latch 114, and latch-driver assembly 116 together define components of global input/output module ("global I/O") 118 for writing data to memory cells 102 of system 100. Global I/O 118 is coupled to one or more local I/O modules 109 to transfer bit line data to memory cells 102 for reading or writing.

Figure 2:
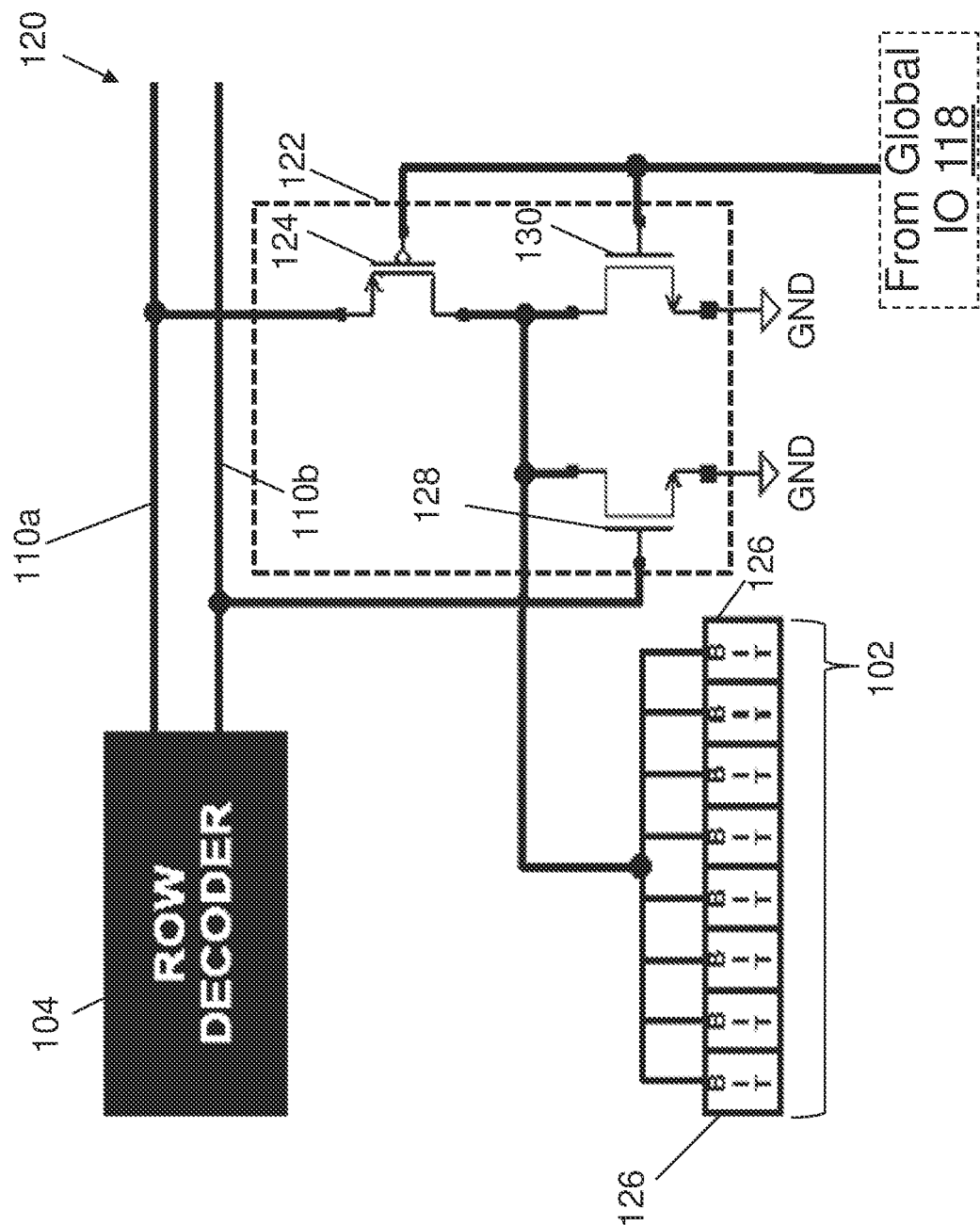
FIG. 2 shows a schematic view of a memory circuit structure according to embodiments of the disclosure.

Referring now to FIG. 2, embodiments of the disclosure may include a memory circuit structure (simply "structure" hereafter) 120 configured for use within byte-write gates BYG0-7 (FIG. 1) of system 100 (FIG. 1), and/or other circuitry for connecting an incoming supply voltage and an incoming data signal to a group of memory elements. In an example implementation, structure 120 may be a byte-write circuit for writing several bits (e.g., a set of eight bits) to memory element(s) 126. In contrast to conventional memory circuit structures, which may be coupled to an external voltage supply and/or other components, embodiments of structure 120 use the voltage in word line 110 (FIG. 1) as a supply voltage for routing incoming data from global I/O module 118 to memory cell(s) 102. A transistor array 122 of structure 120 may be coupled to row decoder 104 through a first word line 110a, having a voltage level corresponding to the voltage output from row decoder 104. Row decoder 104 may also be coupled to a second word line 110b, also known as a "word line bar," which transmits a signal having the inverse logic level from that in first word line 110a.

Transistor array 122 may include a first transistor 124, which is connected at one of its source/drain terminals to first word line 110a. First transistor 124, in one example, may be a p-type field effect transistor (PFET), in which case other transistors of transistor array 122 may be of the same doping type or an opposite doping type as discussed herein. In this configuration, signals transmitted via first word line 110a may be provided to the source/drain of first transistor 124 as a supply voltage for electrically driving the operation of transistor array 122. The other source/drain terminal of first transistor 124 may be coupled to a shared node ("mesh") that includes the input terminal to memory cell 102. Memory cell 102, in turn, may include one or more memory elements 126 for recording binary digits ("bits") transmitted from global I/O module 118 (e.g., via local I/O 109 (FIG. 1)). Memory element(s) 126 may include any currently known or later developed instrument for recording a bit, including volatile and non-volatile memory solutions. Such elements may include a non-volatile memory (NVM) bit cell or a volatile static random-access memory (SRAM) bit cell. The gate terminal of first transistor 124 is electrically coupled to the output from a byte-enable register in global I/O module 118, such that incoming signals selectively couple first line 110a to memory cell 102. When a supply voltage is transmitted to first transistor 124 via first word line 110a, and an incoming write pulse enables current flow from first word line 110a to memory cell 102 through the source/drain terminals of first transistor 124, data is written to memory element(s) 126 of memory cell 102. In this configuration, multiple bits can be written to memory elements 126 of memory cell 102, through the cooperation of first word line 110a and the output(s) transmitted from global I/O module 118 (e.g., via local I/O module 109).

Transistor array 122 may include additional elements to better control when data is written or not written to memory cell 102. For instance, a second transistor 128 may have the opposite doping type relative to first transistor 124 (e.g., N-type doping where first transistor 124 is P-type doping or vice versa) and is coupled at its gate terminal to second word line 110*b*. As described elsewhere herein, second word line 110*b* may have a voltage that is an inverse logic level of the voltage in first word line 110*a* (i.e., second word line 110*b* will be "low voltage" when first word line 110*a* is "high voltage" and vice versa). The source and drain terminals of second transistor 128 may couple the shared node of first transistor 124 and memory cell 102 to ground ("GND"). In this arrangement, any leakage current transmitted through first transistor 124 when there is no incoming voltage from global I/O module 118 will be transmitted to ground instead of to memory cell 102.

Transistor array 122 may also include a third transistor 130 of the same doping type as second transistor 128, and the opposite doping type from first transistor 124 (e.g., N-type doping where first transistor 124 is P-type doping and vice versa). The gate of third transistor 130 is coupled to the output from global I/O module 118 (e.g., via local I/O module 109). The source and drain terminals of third transistor may also couple the shared node for memory cell 102 and first transistor 124 to ground ("GND"). The opposite doping type of third transistor 130 will cause incoming current from first word line 110*a* to be connected to ground instead of memory cell 102 in the case where no signal is transmitted from global I/O module 118. That is, source-drain current flow across third transistor 130 will be enabled when source-drain current flow across first transistor 124 is disabled and vice-versa. Each transistor 124, 128, 130 may include body terminals, e.g., in the case of fully depleted semiconductor on insulator (FDSOI) technology, for controlling the threshold voltage of each transistor, but such terminals are omitted for clarity of illustration.

Referring to FIGS. 1 and 2 together, structure 120 may be included within one or more of byte-write gates BYG0-BYG7. Global controller 106 and/or local controller 108 can select one word line 110 corresponding to memory cell(s) 102 that will receive data from global I/O module 118 in a write operation. Controller(s) 106, 108 thus may cause only certain row decoder(s) 104 to transmit a voltage output via their respective word line 110 (e.g., only row decoder 104*a* transmits an output through word line 110*e*, while row decoder 104*b* does not transmit an output). A targeted column with memory cells 102 for writing data is selected via global I/O module 118 and local I/O module 109.

Figure 3:
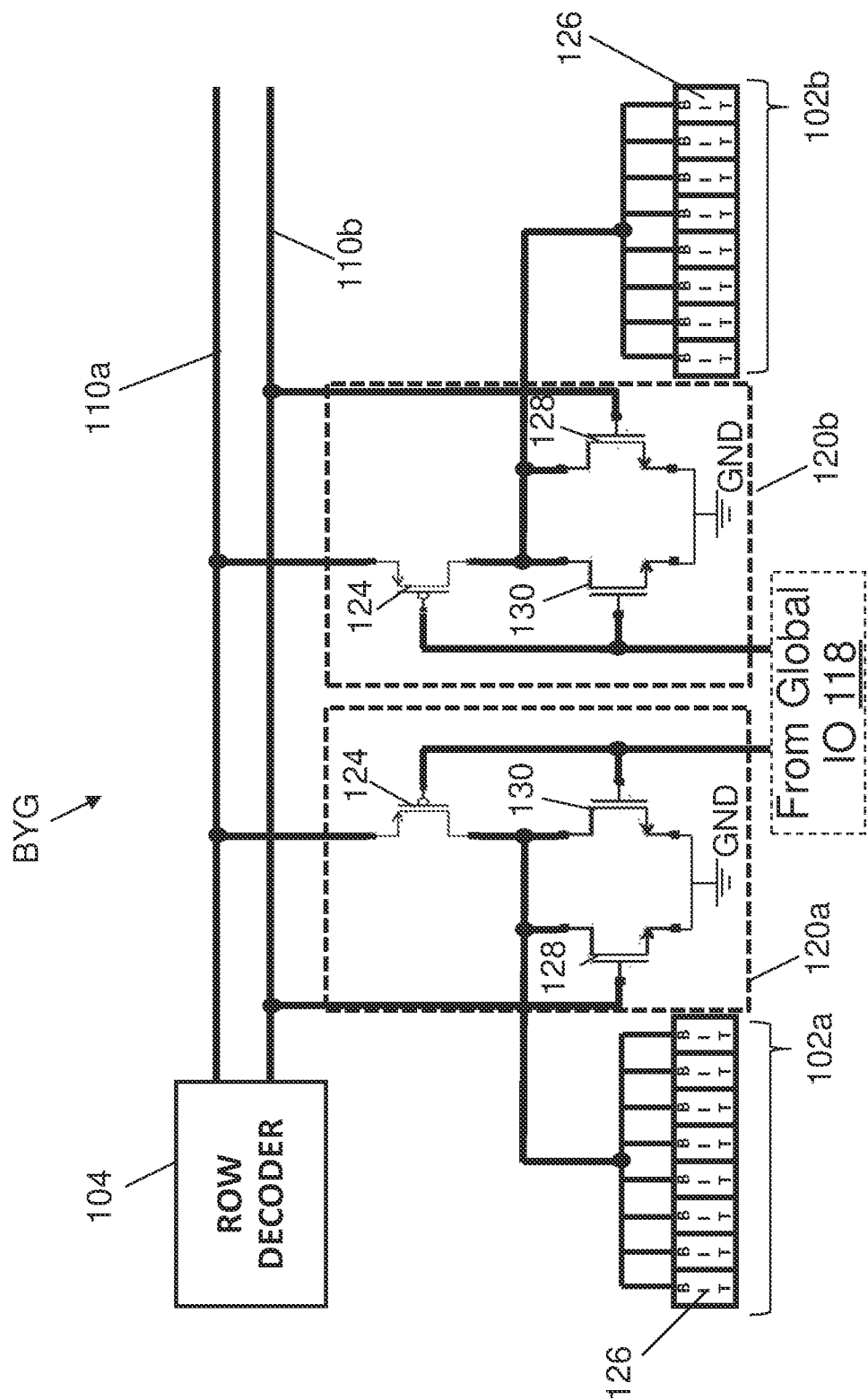
FIG. 3 shows an expanded schematic view of a memory circuit structure for multiple word bytes according to embodiments of the disclosure.

Turning now to FIG. 3 (with continued reference to FIGS. 1 and 2), embodiments of byte-write gates BYG may include several implementations of structure 120 (e.g., first structure 120*a* and second structure 120*b*), each for writing data to a respective memory cell 102*a*, 102*b* coupled thereto. Each structure 120*a*, 120*b* may have the same couplings to row decoder 104 through word line(s) 110*a*, 110*b*, as well as similar but differently positioned couplings to global I/O module 118 and local I/O module 109. Thus, structures 120*a*, 120*b* are coupled to a single row but are located in different columns in an array of memory cells 102. Controller(s) 106, 108 (FIG. 1) may write data by outputting a signal from row decoder 104 to word line 110*a*, while global I/O module 118 may apply a voltage, via local I/O module 109, to the gate of first transistor 124 in only one structure 120 (e.g., structure 120*a*). In this case, data is written to memory cell 102*a* through first structure 120*a*, while no data is written to memory cell 102*b* through second first structure 120*b* even though word line 110*a* is supplying a voltage to both structures 120*a*, 120*b*. In this manner, a byte-write gate BYG supplies a voltage to multiple structures 120 and transistor arrays 122 therein, while global 110 module 118 can select specific memory cells 102 where writing will occur.

Figure 4:
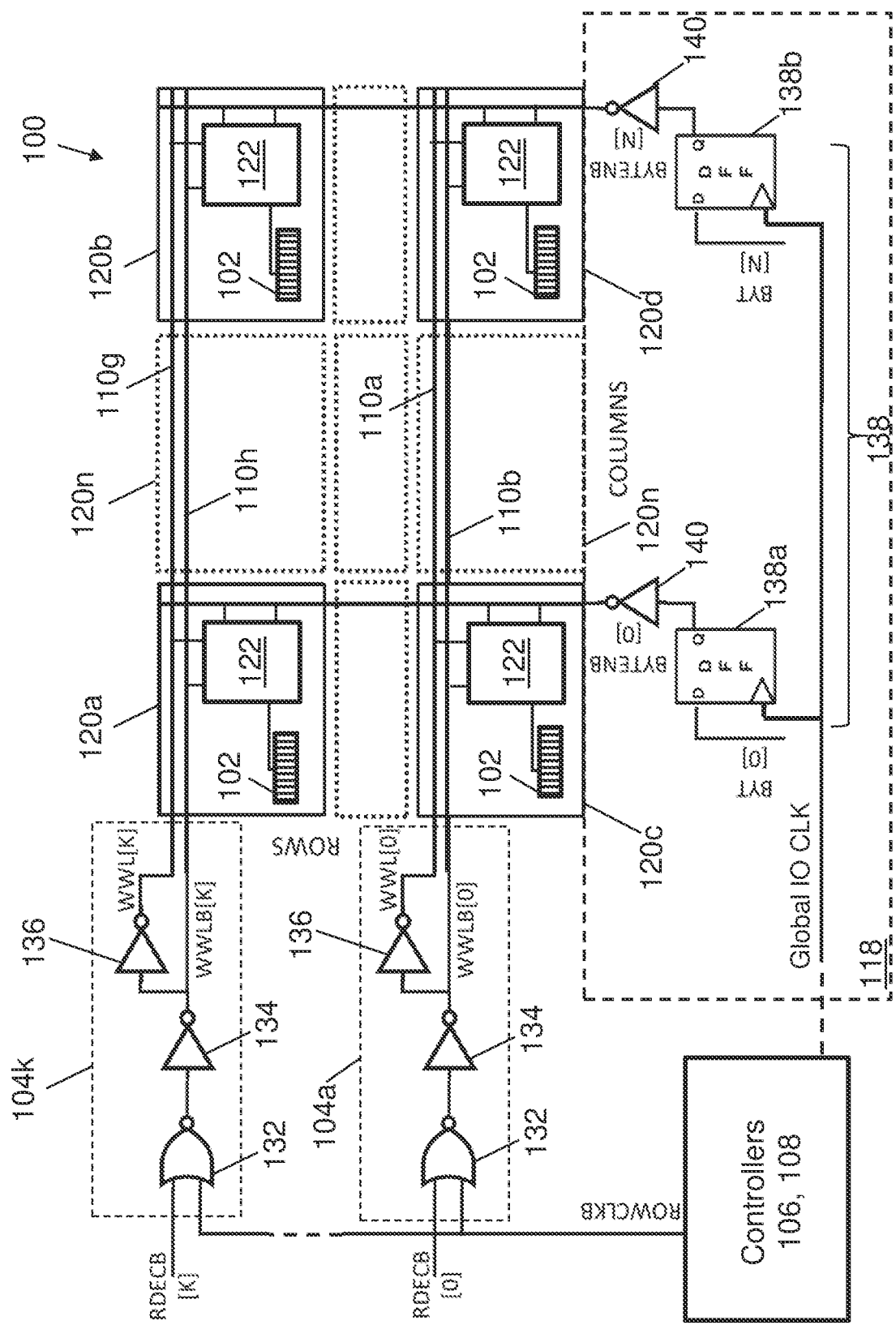
FIG. 4 shows a schematic view of a memory structure coupled to decoders and byte-write registers according to embodiments of the disclosure.

Referring now to FIG. 4 (with continued reference to FIGS. 1-3), further components of system 100 are shown in detail to better illustrate example mechanism for selecting one or more structures 120 in a plurality of structures for writing data thereto. Each structure 120 may include, e.g., transistor array 122 and memory cell(s) 102 as illustrated in FIGS. 2 and 3. As discussed elsewhere herein, global and/or local controllers 106, 108 may be coupled to a group of rows through row decoders 104*a*. Controller(s) 106, 108 also may transmit a clock signal ("Global IO CLK") for driving global I/O module 118 to read and/or write data to memory cells 102. System 100 may include structures 120 arranged in any conceivable number of columns and rows, as indicated by the dashed areas horizontally and vertically between a group of structures 120*a*, 120*b*, 120*c*, 120*d*, at the four corners of a rectangular array. Additional structures 120 within the array are each given the reference sign 120*n* to emphasize that any desired number of columns or rows is possible. An electrical line "ROWCLKB," indicates a clock signal from controller(s) 106, 108 to row decoders 104. Line ROWCLKB includes a dashed section coupled to row decoder 104*k*, where "k" indicates the last row in an unspecified number of rows. Controller(s) 106, 108 may transmit a clock signal only to row decoder(s) 104*a*-104*k* that are selected for writing data. Row decoder(s) 104*a*-104*k* may process such signals through a series of logic gates, or equivalent electrical circuitry/components. For example, an AND gate 132 will transmit an output only when it receives an external input from line RDECB (e.g., a power supply to row decoder(s) 104*a*-104*k*) and the clock signal transmitted from controller(s) 106, 108 through line ROWCLKB. A first inverter 134 receives the output from AND gate 132 to produce an inverted (and optionally amplified) signal for transmission via second word line 110*b*. A second inverter 136 may be coupled to first inverter 134 in parallel with second word line 110*b*. Second inverter 136 may receive the same output to again invert (and optionally amplify) the signal from first inverter 134 for transmission via first word line 110*a*. Controller(s) 106, 108 thus can allow a supply voltage to be transmitted only from selected row decoder(s) 104*a-k* to a row of structures 120 where a write operation is to be performed.

Global I/O module 118 may operate to send byte-enable signals (e.g., via lines BYTENB [0] through [N]) for writing of data through structures 120 in a targeted row. Controller(s) 106, 108 may produce the clock signal (GLOBAL IO CLK) for driving global I/O module 118. Global I/O module 118 may include several byte-enable registers 138 (two shown, labeled respectively as 138*a*, 138*b*), each for transmitting a "byte enable" data signal to a corresponding column in system 100. Byte-enable registers 138*a*, 138*b* each may receive a set of bits for writing at terminal "D," i.e., lines BYT [0] through BYT [N], with N indicating the number of byte write registers in global I/O module 118. Byte-enable registers 138*a*, 138*b* also receive clock signal Global IO CLK to define the frequency at which each bit of data is shifted through byte-enable registers 138*a*, 138*b*. The outgoing data from terminal "Q" of each byte-enable register may pass through a column inverter 140 to invert the logic level (and optionally amplify) the data signal to be transmitted to a column of structures 120 in system 100. Where applicable, column inverter(s) 140 may be included within local I/O module 109 (FIG. 1). The incoming signal may be transmitted to all structures 120 in a single column.

However, data will only be written to memory cell(s) 102 (FIGS. 1-3) in structures 120 that concurrently receive a voltage supply signal from their corresponding row decoder 104a-104k. Thus, controller(s) 106, 108 use global I/O module 118 on the column side to provide data to structure(s) 120 for writing. Row decoders 104a-104k on the row side simultaneously provide a supply voltage to each structure 120.

Referring to FIGS. 3 and 4, embodiments of the disclosure provide methods for writing data to memory elements 126 in addition to the various structures discussed herein. Methods according to the disclosure may include transmitting, via first word line 110a, a supply voltage from row decoder(s) 104a-104k to the source/drain terminal of first transistor 124 in transistor array 122. Methods according to the disclosure also may include transmitting the output from byte-enable register(s) 138 to the gate terminal of first transistor 124. During operation, first transistor 124 receives a supply voltage at its source or drain while also receiving a byte-enable signal at its gate. In this case, structure 120 will transmit the supply voltage to memory cell 102 to write data to memory element(s) 126 thereof. To write data to only selected memory cell(s) 102, controller(s) 106, 108 may select one of several first word lines 110 via a selected row decoder 104. Each structure 120 coupled to the same row decoder 104 will also receive the same supply voltage. However, data will only be written in structure(s) 120 that are in a column where byte-enable register(s) 138 transmit a data output to transistor array 122. Further writing of data may be disabled by ceasing the transmitting of a supply voltage through first word line 110a. As discussed elsewhere herein, second transistor 128, third transistor 130, and/or second word line 110b may be implemented in transistor array(s) 122 to further reduce current leakage through structure(s) 120 when they are not being used to write data to memory cell(s) 102.

Embodiments of the disclosure may provide several technical and commercial advantages, some of which are described herein by example. Embodiments of the disclosure use the voltage in a word line as an adjustable power supply for each memory cell in an array, thus allowing the input voltage to be enabled or disabled via existing hardware for controlling the row decoders in a memory array. By contrast, conventional structures use a dedicated voltage source and accompanying logic to deliver power for writing data, thus producing significantly more leakage in the array when writing does not occur. Additionally, structures according to the disclosure include fewer devices (e.g., only three transistors in an array) to implement writing of data as discussed herein.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

As used herein, the term "configured," "configured to" and/or "configured for" can refer to specific-purpose patterns of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory circuit structure comprising:
   a transistor array for writing a plurality of bits to a memory element, wherein the transistor array includes a first transistor having a first source/drain terminal for receiving a supply voltage, and a gate terminal coupled to an output signal from a byte-enable register, the byte-enable register transmitting the plurality of bits to the gate terminal of the first transistor; and
   a first word line coupled between a decoder and the first source/drain terminal of the first transistor, wherein the first word line transmits a voltage output from the decoder to the first transistor as the supply voltage.

2. The memory circuit structure of claim 1, wherein the transistor array includes a byte-write circuit for writing the plurality of bits to the memory element, and wherein the first transistor includes a p-type field effect transistor (PFET) of the byte-write circuit.

3. The memory circuit structure of claim 1, further comprising a second word line coupled between the decoder and a gate terminal of a second transistor of the transistor array, the second transistor including a pair of source/drain terminals coupling the memory element to ground, wherein a voltage in the second word line is an inverse logic level of the supply voltage from the first word line.

4. The memory circuit structure of claim 1, further comprising a control circuit coupled to the first word line through the decoder, wherein the control circuit:

selects the transistor array and the first word line from a plurality of transistor arrays and a plurality of word lines coupled to the control circuit; and causes the decoder to transmit the voltage output to the transistor array.

5. The memory circuit structure of claim 1, wherein the transistor array is one of a plurality of transistor arrays for writing data to a respective memory element, wherein the first word line transmits the supply voltage to each of the plurality of transistor arrays.

6. The memory circuit structure of claim 1, wherein the memory element includes one of a non-volatile memory (NVM) bit cell and a volatile static random-access memory (SRAM) bit cell.

7. A memory circuit structure comprising:
a transistor array configured to write a plurality of bits to a memory element, the transistor array including:
a first transistor including a first source/drain terminal for receiving a supply voltage, a second source/drain terminal for transmitting the supply voltage, and a gate terminal for receiving a data input, wherein the first transistor has a first doping type,
a second transistor including a first source/drain terminal coupled to the second source/drain terminal of the first transistor and the memory element, and a second source/drain terminal coupled to ground, and
a third transistor including a first source/drain terminal coupled to the second source/drain terminal of the first transistor, a second source/drain terminal coupled to ground, the third transistor having an opposite doping type from the first transistor;
a byte-enable register transmitting an output signal to a gate terminal of the first transistor and a gate terminal of the third transistor, wherein the byte-enable register transmits the plurality of bits to the transistor array; and
a first word line coupled between a decoder and the first source/drain terminal of the first transistor, wherein the first word line transmits a voltage output from the decoder to the first transistor as the supply voltage.

8. The memory circuit structure of claim 7, wherein the transistor array includes a byte-write circuit for writing the plurality of bits to the memory element, and the first doping type is p-type such that the first transistor includes a p-type field effect transistor (PFET) of the byte-write circuit.

9. The memory circuit structure of claim 7, further comprising a second word line coupled between the decoder and a gate terminal of the second transistor of the transistor array, wherein a voltage output from the decoder transmitted to the second word line is an inverse logic level of the supply voltage from the first word line.

10. The memory circuit structure of claim 7, further comprising a control circuit coupled to the first word line through the decoder, wherein the control circuit:

selects the transistor array and the first word line from a plurality of transistor arrays and a plurality of word lines coupled to the control circuit; and causes the decoder to transmit the voltage output to the transistor array.

11. The memory circuit structure of claim 7, wherein the transistor array is one of a plurality of transistor arrays for writing data to a respective memory element, wherein the first word line transmits the supply voltage to each of the plurality of transistor arrays.

12. The memory circuit structure of claim 7, wherein the memory element includes one a non-volatile memory (NVM) bit cell and a volatile static random-access memory (SRAM) bit cell.

13. A method for writing data to a memory element, the method comprising:
transmitting, via a first word line, a voltage output from a decoder as a supply voltage to a source/drain terminal of a first transistor of a transistor array; and
transmitting an output from a byte-enable register to a gate terminal of the first transistor, wherein the byte-enable register transmits a plurality of bits to the gate terminal such that the output from the byte-enable register causes the transistor array to write the plurality of bits to the memory element.

14. The method of claim 13, further comprising:
selecting the first word line from a plurality of word lines; and
transmitting the voltage output solely to the selected first word line.

15. The method of claim 13, further comprising transmitting voltage output to a plurality of additional transistor arrays coupled to the first word line, each of the plurality of additional transistor arrays configured to write data to a respective memory element.

16. The method of claim 13, further comprising transmitting, via a second word line, an inverted supply voltage to a gate terminal of a second transistor of the transistor array, the second transistor having a pair of source/drain terminals for coupling a second source/drain terminal of the first transistor to ground.

17. The method of claim 13, further comprising ceasing transmitting of the voltage output through the first word line to prevent further writing of data to the memory element.

18. The method of claim 17, wherein the memory element includes one of a non-volatile memory (NVM) bit cell and a volatile static random-access memory (SRAM) bit cell, such that data is retained in the NVM bit cell or the volatile SRAM bit cell while ceasing transmitting of the voltage output through the first word line.

* * * * *